(12) United States Patent
Faye et al.

(10) Patent No.: US 6,650,169 B2
(45) Date of Patent: Nov. 18, 2003

(54) GATE DRIVER APPARATUS HAVING AN ENERGY RECOVERING CIRCUIT

(75) Inventors: Li Faye, Flushing, NY (US); Qian Jinrong, Plano, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/968,093

(22) Filed: Oct. 1, 2001

(65) Prior Publication Data

US 2003/0062930 A1 Apr. 3, 2003

(51) Int. Cl.[7] .............................................. H03K 17/62
(52) U.S. Cl. ...................... 327/404; 327/427; 327/440; 327/581; 363/26
(58) Field of Search ................................ 327/403, 404, 327/419, 427, 442, 574, 581, 108–111, 434; 326/82, 83, 88; 307/412; 363/22, 24, 26

(56) References Cited

U.S. PATENT DOCUMENTS

| | | | | |
|---|---|---|---|---|
| 5,010,261 A | * | 4/1991 | Steigerwald | 327/404 |
| 5,264,736 A | * | 11/1993 | Jacobson | 327/100 |
| 6,208,535 B1 | * | 3/2001 | Parks | 363/26 |

* cited by examiner

*Primary Examiner*—Minh Nguyen
(74) *Attorney, Agent, or Firm*—Steven R. Biren

(57) ABSTRACT

A novel gate driver apparatus in which an energy recovery circuitry is incorporated in a square-wave gate driver. The energy recovery circuitry has a first loop circuit for discharging the energy from the gate capacitor to an inductor when the gate driver is turned off, and a second loop circuit for discharging the energy from the inductor to the power supply. Thus, the energy of the gate capacitor is transferred to the power source when the gate driver is turned off, and the gate driver apparatus still maintains its operating flexibility as the square-wave driver and is independent of switching frequency.

17 Claims, 3 Drawing Sheets

US 6,650,169 B2

GATE DRIVER APPARATUS HAVING AN ENERGY RECOVERING CIRCUIT

TECHNICAL FIELD

This invention relates to gate drivers for power MOSFETs, and more particularly, to a gate driver apparatus in which an energy recovering circuit is incorporated with a square-wave gate driver so that the turn-off loss in the gate driver is recovered.

BACKGROUND OF THE INVENTION

Presently, gate drivers for power MOSFETs can be categorized as three major classes, i.e., the square-wave, quasi-resonant and resonant drivers. The square-wave gate driver as illustrated in FIG. 1 is typically implemented in an IC which consists of a pair of totem pole N and P-channel switches driven by the same control signal. The advantages of the square-wave driver are its simplicity in implementation and its independence of switching frequency. However, there is no scheme for recovering turn-on and turn-off energy losses resulting from charging and discharging of the gate capacitance of the MOSFETs, which can become intolerable for high frequency operation.

The quasi-resonant driver as shown in FIG. 2 can eliminate the turn-on loss in the gate driver, and the resonant driver as illustrated in FIG. 3 can eliminate both turn-on and turn off losses by circulating energy between the resonant inductor Lg and the effective gate capacitor $C_g$ during each switching cycle. However, unlike the square-wave driver which can work in "pulse width modulation (PWM)" mode as well as in "variable frequency control" mode, both quasi-resonant and resonant drivers can work properly only in a narrowed frequency range of "variable frequency control" mode due to their dependence of switching frequency and duty cycle. Thus, the operating frequency of the circuit in the quasi-resonant and resonant drivers is severely limited.

Therefore, there exists a need of a gate driver which, on one hand, is switching frequency independent, and on the other hand, is capable of recovering some energy from the gate capacitance of the MOSFET.

SUMMARY OF THE INVENTION

The present invention provides a novel gate driver apparatus in which an energy recovery circuit is incorporated in a square-wave gate driver. The energy recovery circuitry is capable of recovering the turn-off loss by transferring the energy stored in the gate capacitor to the power source during a turn-off operation of the gate driver. In particular, the energy recovery circuitry comprises a first loop circuit for discharging the energy from the gate capacitor to an inductor when the gate driver is turned off, and a second loop circuit for discharging the energy from the inductor to the power supply. The first loop circuit is formed by turning on a first device, preferably a FET, and the second loop circuit is formed by utilizing an unidirectional device, preferably a diode. Thus, the energy of the gate capacitor is transferred to the power source when the gate driver is turned off, and the gate driver apparatus still maintains its operating flexibility as the square-wave driver which is independent of switching frequency.

BRIEF DESCRIPTION OF THE DRAWINGS

The above and further features and advantages of the invention will be clearer upon reading the detailed description of the preferred embodiment of the present invention with reference to the accompanying drawings in which.

DETAILED DESCRIPTION OF THE PREFERRED EMBODIMENT

Figure 4:
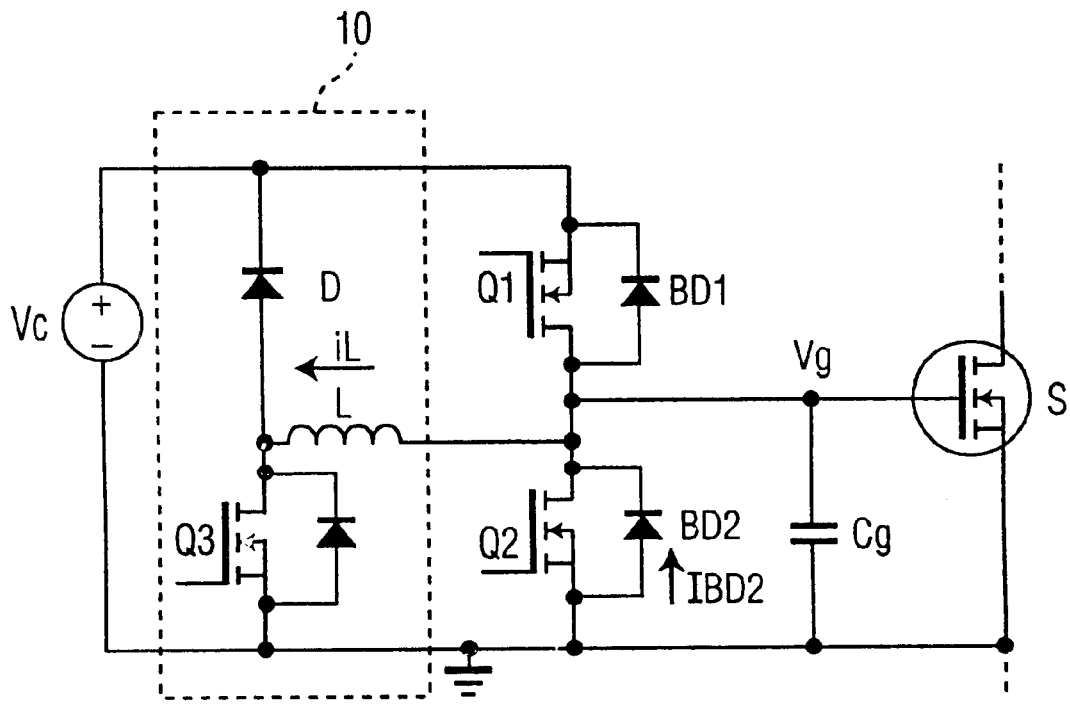
FIG. 4 is the circuit of the gate driver apparatus of the present invention.

As shown in FIG. 4, according to the novel gate driver apparatus of the present invention, an energy recovery circuitry (as shown within the dashed box 10) is incorporated with a square-wave gate driver circuitry to recover the turn-off loss in the gate driver. In particular, the energy recovery circuitry comprises an inductor L and an unidirectional conducting D, and a switch Q3. Here in this embodiment Q3 is a FET while D is a diode.

As shown in FIG. 4, inductor L is connected between the gate capacitor $C_g$ and the juncture of the FET Q3 and the diode D. Upon turning on the FET Q3 and the diode D during the turn-off operation of the gate driver, two loop circuits will be formed for the purpose of recovering the energy from the gate capacitor $C_g$ to the power supply Vc in two consecutive steps, which will be explained in more details below.

Figure 1:
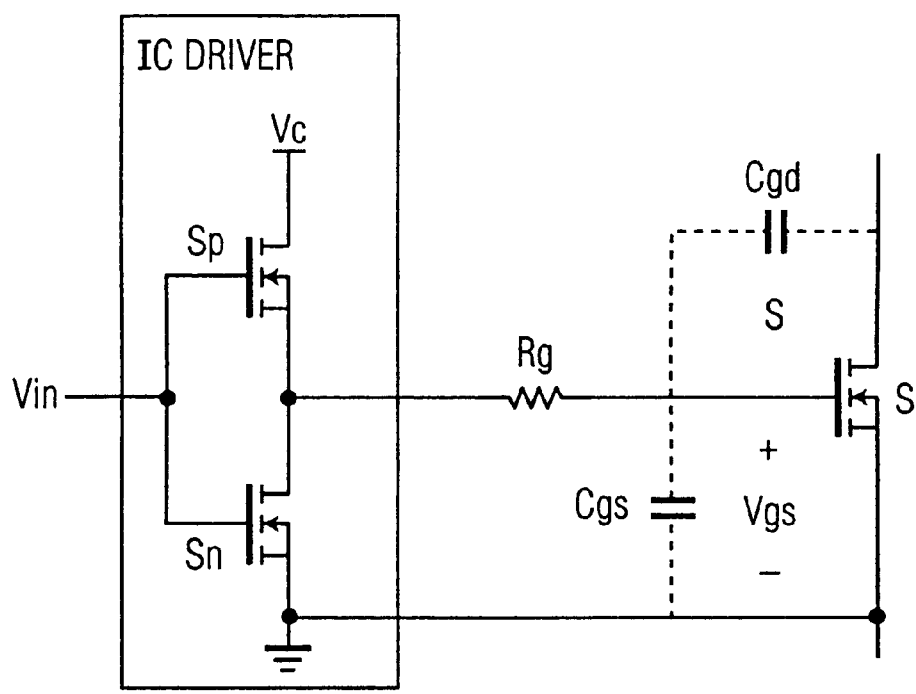
FIG. 1 illustrates a conventional square-wave gate driver circuit.
Figure 2:
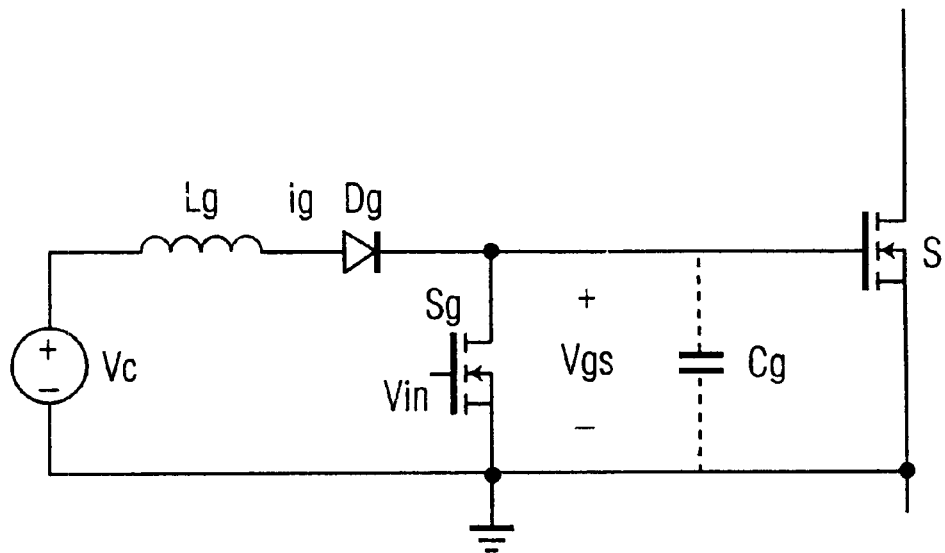
FIG. 2 illustrates a quasi-resonant gate driver circuit.
Figure 3:
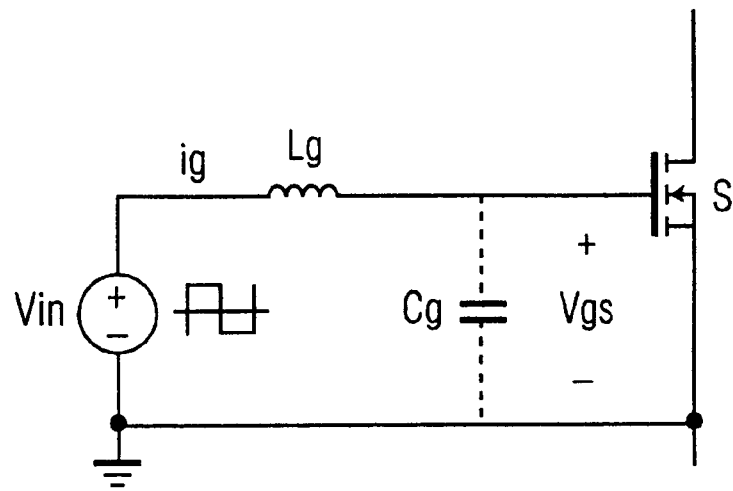
FIG. 3 illustrates a resonant gate driver circuit.

To turn on the main FET S, the FET Q1 in the square-wave gate driver circuit is turned on and charges the gate capacitor $C_g$ to Vc so as to pull the gate of S up, as in the same way as in a conventional square-wave gate driver as shown in FIG. 1.

To turn off the main FET S, however, the gate driver apparatus of the present invention operates in a different way from that in a conventional square-wave gate driver as shown in FIG. 1. In particular, after Q1 is turned off, the FET Q2 of the square-wave gate driver circuitry is not immediately turned on for clamping the gate to ground as it does in a conventional square-wave gate driver. Instead, a dead time $t_d$ is added between the turn-off of Q1 and the turn-on of Q2 for the energy recovery circuitry to operate for recovering the turn-off gate energy back to the power supply $V_c$, the details of which is shown in the timing diagram FIG. 5.

Figure 5:
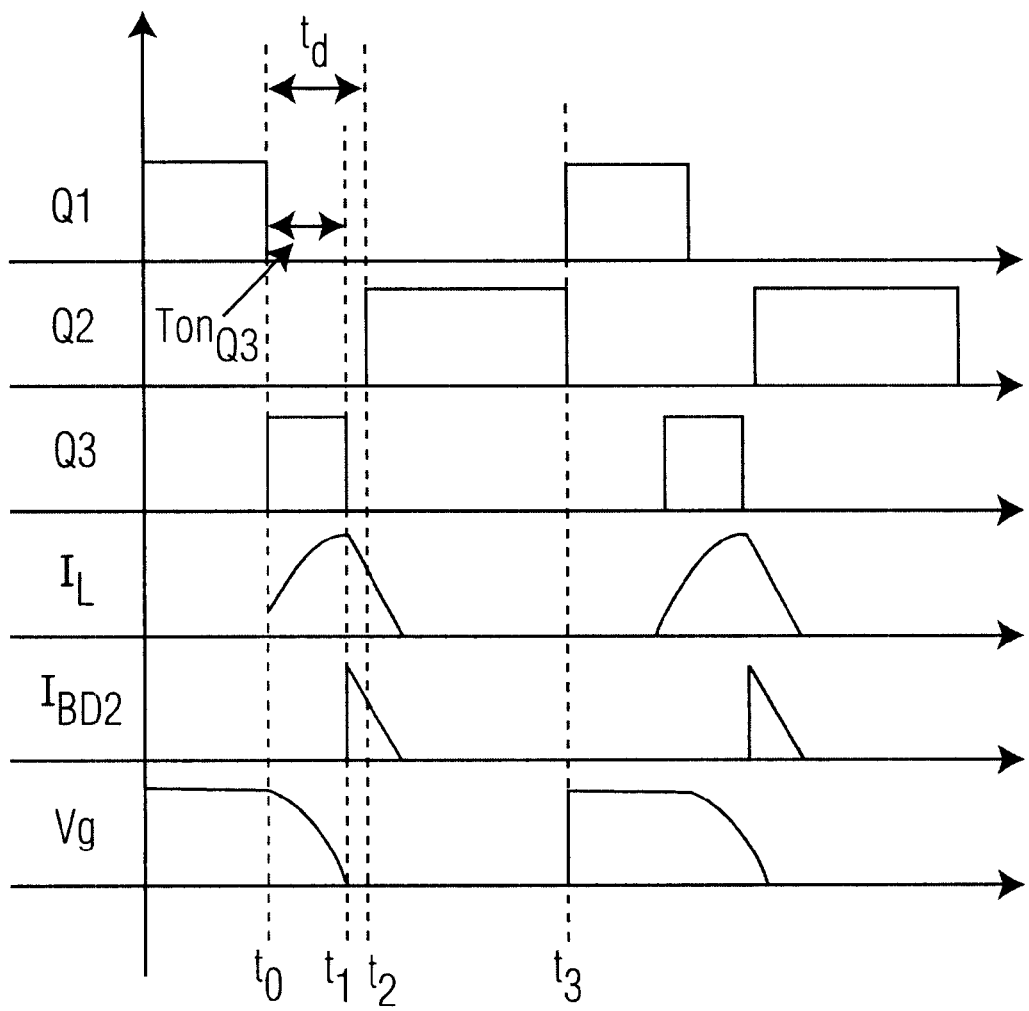
FIG. 5 is the timing diagram for the gate driver apparatus in FIG. 4.

In particular, when Q1 is turned off at time $t_0$, Q3 is turned on, as shown in FIG. 5. A first loop circuit is formed between $C_g$, L, Q3 and, discharge or transfer the energy from the gate capacitor $C_g$ to the resonant inductor L in a resonant fashion. Q3 is kept on for a time period $Ton_{Q3}$ until $t_1$.

The on time of Q3 is fixed by the design of the inductor L and the gate capacitor $C_g$, and is given by equation:

$$Ton_{Q3} = \frac{\pi}{2}\sqrt{L \cdot C_g}$$

The total dead time td should be slightly longer than $Ton_{Q3}$, preferably with a margin of 10–20%.

At $t_1$ when Q3 is turned off, the energy stored in the resonant inductor L is returned to the power supply through the diode D and the body diode BD2 of the FET Q2. Thus, the energy stored in the gate capacitor $C_g$ is fully recovered.

At $t_2$, Q2 is turned on at zero voltage and the gate of S is clamped to ground to complete discharging any remaining energy in the gate capacitor $C_g$.

As shown in FIG. 5, the waveform of the gate voltage $V_g$ resembles a square wave except during the falling edge where it is modified by the energy recovery circuitry to a sinusoidal wave shape.

It shall be appreciated that the dead time td is not a function of duty cycle and the switching frequency of the power stage. Therefore, the gate driver apparatus of the present invention can easily replace any conventional square-wave drive with the added advantage of recovering the turn-off gate energy.

The above has described a preferred embodiment in detail. It shall be appreciated that, without departing the spirit of the invention, various changes and modifications are apparent to a person skilled in the art. Thus, the scope of the invention is solely intent to be limited in the accompanying claims.

What is claimed is:

1. A gate driver apparatus for driving a power MOSFET, comprising:

a power supply for providing control driving power;

a square wave gate driver circuit for charging a gate capacitor so as to turn on said power MOSFET wherein said gate capacitor is connected to the gate of said power MOSFET;

an energy recovery circuit for discharging said gate capacitor to said power supply during a turn-off operation of said square wave gate driver said energy recovery circuit comprising:

a. a resonant inductor having first and second terminals;
   b. a first controllable conducting device connected between said second terminal and to a first side of said power supply
   c. a first unidirectional conducting device connected in series with said first controllable conducting device and to a second side of said power supply; and
   d. a second unidirectional conducting device connected to said second terminal and in parallel with said first controllable conducting device;
   e. wherein said first terminal of said resonant inductor is connected to said gate capacitor.

2. The gate driver apparatus of claim 1 wherein said first controllable conducting device is a FET.

3. The gate driver apparatus of claim 1 wherein said first and second unidirectional conducting devices are diodes.

4. The gate driver apparatus of claim 1 further comprising a second controllable conducting device in connection between said first terminal of said resonant inductor and said first side of said power supply for discharging energy from said inductor to said power supply.

5. The gate driver apparatus of claim 4 wherein said second controllable conducting device is a FET.

6. The gate driver apparatus of claim 1 wherein said square wave gate driver circuit comprises a third controllable conducting device for forming a loop circuit via which said power supply charges said gate capacitor.

7. The gate driver apparatus of claim 6 wherein said third controllable conducting device is a FET.

8. A method of recovering energy in a turn-off operation of a square wave gate driver for driving a power MOSFET, comprising:

providing an energy recovery circuitry for discharging a gate capacitor to a power supply of said square wave gate driver during said turn-off operation of said square wave gate driver;

discharging said gate capacitor through said energy recovery circuitry when said square wave gate driver is turned off wherein said energy recovery circuitry comprises:

a. a resonant inductor having first and second terminals;
   b. a first controllable conducting device connected between said second terminal and a first side of said power supply;
   c. a first unidirectional conducting device connected in series with said first controllable conducting device and to a second side of said power supply; and
   d. a second unidirectional conducting device connected to said second terminal and in parallel with said first controllable conducting device;
   e. wherein said first terminal of said resonant inductor is connected to said gate capacitor.

9. The method of claim 8 wherein said discharging comprises a step of, after said square wave gate driver is turned off, forming a first loop circuit to discharge energy from said gate capacitor to said resonant inductor.

10. The method of claim 9 wherein said step of forming said first loop is realized by turning on said first controllable conducting device.

11. The method of claim 10 wherein said discharging further comprises a step of keeping said first controllable conducting device on for a predetermined time period.

12. The method of claim 11 wherein said predetermined time period is defined by the expression $$\frac{\pi}{2}\sqrt{L \cdot C_g},$$

wherein L is an inductance of said resonant inductor and Cg is an capacitance of said gate capacitor.

13. A gate driver apparatus for controlling a power MOSFET, comprising:

a power supply for providing control driving power;

a square wave gate driver circuitry comprising:

a first conducting device connected between a first terminal of the power supply and a gate capacitor for forming a first loop circuit for charging said power supply to said gate capacitor when said gate driver apparatus is on;

a second conducting device connected between said gate capacitor and a second terminal of said power supply for forming a second loop circuit for discharging energy from said gate capacitor to said second terminal of said power supply when said gate driver is turned off;

a turn-off energy recover circuitry comprising:

an inductor connected to said gate capacitor for storing energy discharged from said gate capacitor;

a third conducting device connected between said inductor and said second terminal of said power supply for forming a third loop circuit to discharge energy of said gate capacitor through said inductor;

a fourth conducting device connected between said inductor and said first terminal of said power supply for forming a fourth loop circuit to discharge energy from said inductor to said power supply;

whereby energy in said gate capacitor is recovered through said recovery circuitry when said gate driver apparatus is being turned off.

14. The gate driver of claim 13 wherein said first conducting device is a FET.

15. The gate driver of claim 13 wherein said second conducting device is a FET.

16. The gate driver of claim 13 wherein said third conducting device is a FET.

17. The gate driver of claim 13 wherein said fourth conducting device is a diode.

* * * * *